United States Patent
Takahashi et al.

(10) Patent No.: US 8,420,436 B2
(45) Date of Patent: Apr. 16, 2013

(54) METHOD FOR MANUFACTURING SOLAR CELL, ETCHING DEVICE, AND CVD DEVICE

(75) Inventors: Hirohisa Takahashi, Sammu (JP); Satoru Ishibashi, Sammu (JP); Sadayuki Ukishima, Sammu (JP); Masahide Matsubara, Matsudo (JP); Satoshi Okabe, Kashiwa (JP)

(73) Assignee: ULVAC, Inc., Chigasaki-Shi (JP)

( * ) Notice: Subject to any disclaimer, the term of this patent is extended or adjusted under 35 U.S.C. 154(b) by 111 days.

(21) Appl. No.: 13/126,108

(22) PCT Filed: Oct. 27, 2009

(86) PCT No.: PCT/JP2009/005675
§ 371 (c)(1), (2), (4) Date: Jun. 23, 2011

(87) PCT Pub. No.: WO2010/050189
PCT Pub. Date: May 6, 2010

(65) Prior Publication Data
US 2011/0256659 A1 Oct. 20, 2011

(30) Foreign Application Priority Data
Oct. 29, 2008 (JP) ................. P2008-278725

(51) Int. Cl.
*H01L 31/0236* (2006.01)

(52) U.S. Cl.
USPC ............. 438/71; 438/609; 438/754; 438/964; 257/E33.064; 257/E33.074; 257/E31.13

(58) Field of Classification Search ............ 438/71, 438/609, 754, 964, FOR. 431; 257/E33.064, 257/E33.074, E31.13
See application file for complete search history.

(56) References Cited

U.S. PATENT DOCUMENTS

| 6,015,759 A | 1/2000 | Khan et al. |
| 6,060,826 A | 5/2000 | Ueda et al. |

(Continued)

FOREIGN PATENT DOCUMENTS

| DE | 197 13 215 | 10/1998 |
| JP | 60-175465 | 9/1985 |

(Continued)

OTHER PUBLICATIONS

Search Report from corresponding EPO Appln. No. 09823302.6 dated Jun. 8, 2012.

(Continued)

*Primary Examiner* — George Fourson, III
(74) *Attorney, Agent, or Firm* — Grossman, Tucker, Perreault & Pfleger, PLLC (57) ABSTRACT

A solar cell manufacturing method according to the present invention is a solar cell manufacturing method that forms a transparent conductive film of ZnO as an electric power extracting electrode on a light incident side, the method comprises at least in a following order: a process A forming the transparent conductive film on a substrate by applying a sputtering voltage to sputter a target made of a film formation material for the transparent conductive film; a process B forming a texture on a surface of the transparent conductive film; a process C cleaning the surface of the transparent conductive film on which the texture has been formed using an UV/ozone; and a process D forming an electric power generation layer on the transparent conductive film.

8 Claims, 10 Drawing Sheets

U.S. PATENT DOCUMENTS

| | | | |
|---|---|---|---|
| 6,331,672 B1 * | 12/2001 | Matsuda et al. | 136/256 |
| 8,022,291 B2 * | 9/2011 | Thomsen et al. | 136/256 |
| 2004/0170755 A1 * | 9/2004 | Lee et al. | 427/66 |
| 2007/0151596 A1 * | 7/2007 | Nasuno et al. | 136/256 |
| 2008/0142810 A1 * | 6/2008 | Tompa et al. | 257/76 |
| 2008/0163917 A1 | 7/2008 | Rech et al. | |
| 2008/0236657 A1 | 10/2008 | Brabec et al. | |
| 2009/0308458 A1 | 12/2009 | Aramaki et al. | |
| 2011/0020971 A1 * | 1/2011 | Sun et al. | 438/57 |
| 2012/0097239 A1 * | 4/2012 | Sato et al. | 136/256 |

FOREIGN PATENT DOCUMENTS

| | | |
|---|---|---|
| JP | 2-503615 | 10/1990 |
| JP | 2002-25350 | 1/2002 |
| JP | 2003-264058 | 9/2003 |
| WO | 88/09265 | 12/1988 |
| WO | 2005/081324 | 9/2005 |
| WO | 2007/126102 | 11/2007 |

OTHER PUBLICATIONS

Muller et al., "TCO and light trapping in silicon thin film solar cells", Solar Energy, Pergamon Press, Oxford, GB, vol. 77, No. 6, Dec. 1, 2004, pp. 917-920.

Vig, "UV/ozone cleaning of surfaces", Journal of Vacuum Science and Technology: Part A AVS/AIP, Melville, NY, US, vol. 3, No. 3, May 1, 1985, pp. 1027-1034.

Bhosle et al., "Gallium-doped zinc oxide films as transparent electrodes for organic solar cell applications", Journal of Applied Physics, American Insitute of Physics, New York, US, vol. 102, No. 2 Jul. 16, 2007, pp. 23501-1 to 23501-5.

Jiang et al., "Aluminum-doped zinc oxide films as transparent conductive electrode for organic light-emitting devices", Applied Physics Letters, AIP, American Institute of Physics, Mellville, NY, US vol. 83, No. 9, Sep. 1, 2003, pp. 1875-1877.

Olson et al., "Effect of ZnO processing on the photovoltage of ZnO/poly(3-hexylthiophene) solar cells", Journal of Physical Chemistry C Jul. 3, 2008 American Chemical Society US, vol. 112, No. 26, Jul. 3, 2008, pp. 9544-9547.

Coppa et al., "In situ cleaning and characterization of oxygen- and zinc-terminated, n-type, ZnO{0001} surfaces", Journal of Applied Physics, American Institute of Physics, New York, US, vol. 95, No. 10, May 15, 2004, pp. 5856-5864.

International Search Report from corresponding PCT Application No. PCT/JP2009/005675 dated Jan. 19, 2010.

* cited by examiner

METHOD FOR MANUFACTURING SOLAR CELL, ETCHING DEVICE, AND CVD DEVICE

TECHNICAL FIELD

The present invention relates to a solar cell manufacturing method, and more particularly to a solar cell manufacturing method capable of removing contamination at the time of etching treatment on a transparent conductive film used in a solar cell and capable of fabricating a solar cell with an excellent power generation property. Furthermore, the present invention relates to an etching device and a CVD device that are preferably used for the manufacturing method.

Priority is claimed on Japanese Patent Application No. 2008-278725, filed on Oct. 29, 2008, the content of which is incorporated herein by reference.

BACKGROUND ART

In solar cells, when energy particles, called photons, included in solar rays hit an i-layer, electrons and holes are generated by the photovoltaic effect. The electrons move toward an n-layer. The holes move toward a p-layer. The electrons produced by the photovoltaic effect are extracted by an upper electrode and a rear surface electrode. Thereby, light energy is converted into electric energy.

Figure 11:
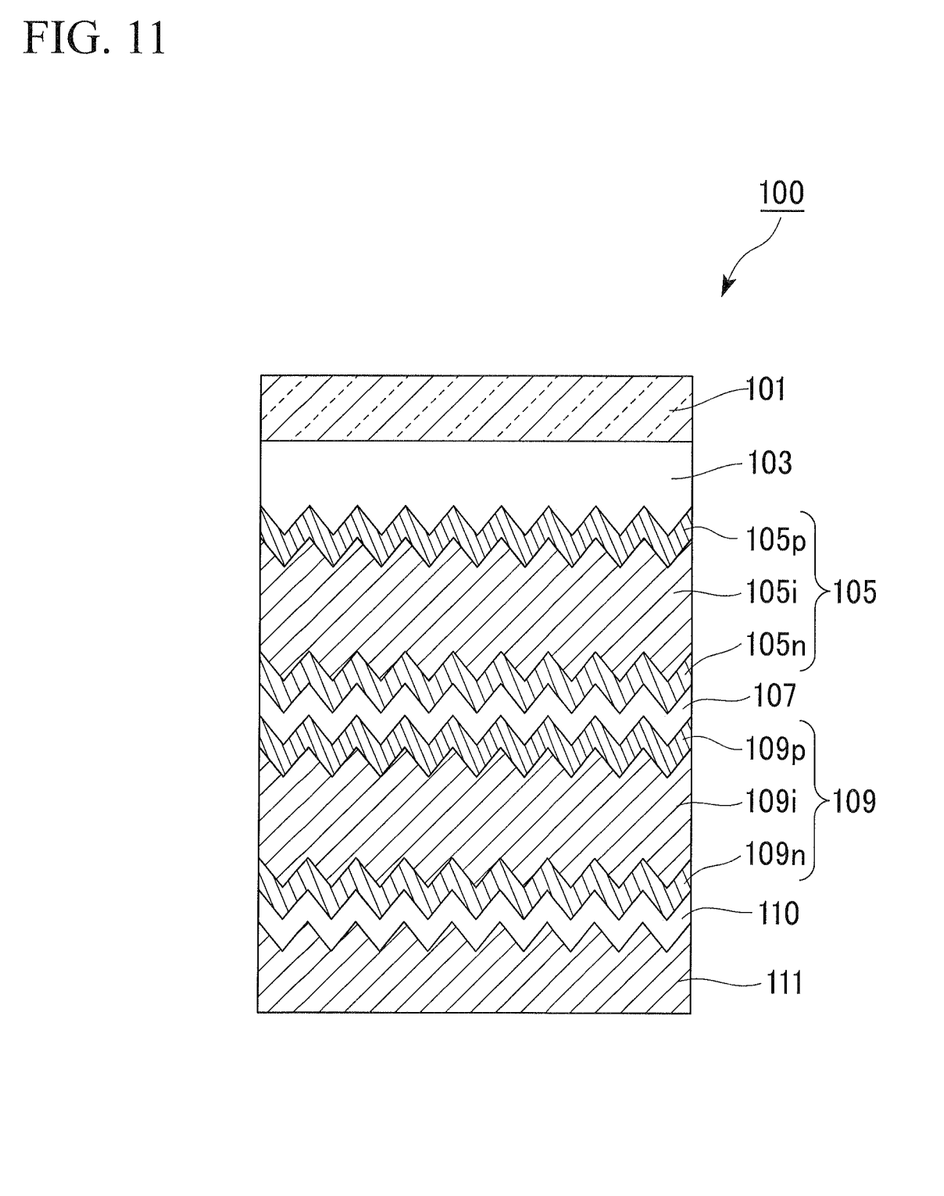
FIG. 11 is a cross-sectional view showing an exemplary conventional solar cell.

FIG. 11 is a schematic cross-sectional view of an amorphous silicon solar cell. In a solar cell 100, there are stacked in order from top to bottom in the figure: a glass substrate 101 that forms a surface of the solar cell; an upper electrode 103 made of a zinc-oxide-based transparent conductive film that is provided on the glass substrate 101; a top cell 105 made of amorphous silicon; an intermediate electrode 107 made of a transparent conductive film; a bottom cell 109 made of microcrystalline silicon, a buffer layer 110 made of a transparent conductive film; and a rear surface electrode 111 made of a metal film (for example, see Patent Document 1). The intermediate electrode 107 is provided between the top cell 105 and the bottom cell 109.

The top cell 105 is made of three layers of: a p-layer 105$p$, an i-layer 105$i$, and an n-layer 105$n$. The i-layer 105$i$ is formed of amorphous silicon. Furthermore, the bottom cell 109 is also made of three layers of: a p-layer 109$p$, an i-layer 109$i$, and an n-layer 109$n$, similarly to the top cell 105. Of these, the i-layer 109$i$ is made of microcrystalline silicon.

In the solar cell 100 like this, solar light incident from the glass substrate 101 side passes through the upper electrode 103, the top cell 105 (p-i-n-layer), and the buffer layer 110, and is then reflected off the rear surface electrode 111. To improve the conversion efficiency of the solar cell for light energy, a method is adopted such as causing the solar light to reflect off the rear surface electrode 111 or providing the upper electrode 101 with a texture structure. The texture structure has both of a prism effect of extending the optical path of the incident solar light and an effect of enclosing the light. The buffer layer 110 has an object to prevent diffusion of the metal film used for the rear surface electrode 111 and other objects (for example, see Patent Document 2).

In the device structures of different solar cells, different wavelength bands are used for the photovoltaic effect. However, in any of the solar cells, requirements for the transparent conductive film used as the upper electrode include a property of transmitting light for absorption in the i-layer and an electrical conduction property allowing the electrons generated by the photovoltaic effect to be extracted. As the transparent conductive film for the upper electrode, an FTO thin film in which $SnO_2$ is doped with fluorine as impurity or a ZnO-based oxide thin film is used. As for the buffer layer, the requirements include a property of transmitting light reflected off the rear surface electrode for absorption in the i-layer and light reflected off the rear surface electrode, and an electrical conduction property for moving the holes to the rear surface electrode.

Properties required for the transparent conductive films for use in solar cells include roughly three elements of: (1) conductivity property, (2) optical property, and (3) a texture structure. As for (1) conductivity property, low electrical resistance is required in order to extract the generated electricity. Typically, the FTO (fluorine-doped tin oxide) used for the transparent conductive film for a solar cell is a transparent conductive film fabricated by CVD method. The FTO obtains conductivity property by doping $SnO_2$ with F, so that F is replaced by O. Furthermore, a ZnO-based material which receives much attention as a post-ITO (indium tin oxide) is capable of being deposited by sputtering. By doping a material including oxygen defect and Al or Ga to the ZnO, conductivity property can be obtained.

As for (2) optical property, an optical property of transmitting the wavelength band that is absorbed in an electric power generation layer is required because a transparent conductive film for a solar cell is mainly used on the incident light side.

As for (3) texture structure, a texture structure that disperse light in order to efficiently absorb solar light in the electric power generation layer is required. Normally, a ZnO-based thin film fabricated by a sputtering process has a flat surface. Therefore, a treatment of forming a texture by wet etching or the like is required.

However, in the case of forming a transparent conductive film for a solar cell by sputtering and subsequently wet etching a ZnO-based material, carbon-based contamination is generated while etching is performed using a typical oxalic acid-based etching solution or the like as an etching solution for amorphous ITO. The contamination degrades a series resistance of the solar cell, and resulting in decrease in conversion efficiency of the solar cell.

PRIOR ART DOCUMENTS

Patent Documents

Patent Document 1: Published Japanese Translation No. H02-503615 of PCT International Publication
Patent Document 2: Japanese Unexamined Patent Application, First Publication No. S60-175465

DISCLOSURE OF INVENTION

Problems to be Solved by the Invention

The present invention has been achieved in view of such circumstances, and has a first object to provide a solar cell manufacturing method capable, in the case of forming a transparent conductive film made of a ZnO-based material by sputtering and of subsequently forming a texture by a wet etching treatment, of: removing contamination at the time of etching the transparent conductive film and preventing a decrease in series resistance, and consequently, a decrease in photoelectric conversion efficiency resulting from the contamination; and fabricating a solar cell with an excellent electric power generation property.

Furthermore, the present invention has a second object to provide an etching device that performs wet etching on a transparent conductive film for a solar cell, capable of removing contamination at the time etching the transparent conductive film, of preventing a decrease in property resulting from the contamination, and of fabricating a transparent conductive film for a solar cell with an excellent electric power generation property.

Furthermore, the present invention has a third object to provide a CVD device (CVD apparatus) that forms an electric power generation layer for a solar cell by CVD method, capable of removing contamination on a base substance on which the electric power generation layer is to be formed, of preventing a decrease in property resulting from the contamination, and of fabricating an electric power generation layer for a solar cell with an excellent electric power generation property.

Means for Solving the Problems

A solar cell manufacturing method according to an embodiment of the present invention is a solar cell manufacturing method that forms a transparent conductive film of ZnO as an electric power extracting electrode on a light incident side, the method includes, at least in a following order: a process A forming the transparent conductive film on a substrate by applying a sputtering voltage to sputter a target made of a film formation material for the transparent conductive film; a process B forming a texture on a surface of the transparent conductive film; a process C cleaning the surface of the transparent conductive film on which the texture has been formed using an UV/ozone; and a process D forming an electric power generation layer on the transparent conductive film.

The solar cell manufacturing method according to the embodiment of the present invention may adopt a structure wherein a horizontal magnetic field is generated while the sputtering voltage is being applied, to thereby the target is sputtered.

The solar cell manufacturing method according to the embodiment of the present invention may adopt a structure wherein an upper electrode as the electric power extracting electrode on the light incident side is formed by using the transparent conductive film.

The solar cell manufacturing method according to the embodiment of the present invention may adopt a structure wherein, in the process B, the texture is formed by wet etching.

The solar cell manufacturing method according to the embodiment of the present invention may adopt a structure wherein, in the process A, a material in which ZnO is doped with a substance including Al or Ga is used as the film formation material for the transparent conductive film.

An etching device according to an embodiment of the present invention is an etching device that performs wet etching on a transparent conductive film for a solar cell may include a cleaning unit that uses a UV/ozone to clean a surface of the transparent conductive film after the wet etching.

The etching device according to the embodiment of the present invention may further include a wet etching portion that performs the wet etching on the transparent conductive film, wherein the cleaning unit is provided downstream of the wet etching portion.

The etching device according to the embodiment of the present invention may further include an electric power generation layer forming portion that forms an electric power generation layer, wherein the electric power generation layer forming portion is provided downstream of the cleaning unit.

A CVD device according to an embodiment of the present invention is a CVD device that forms an electric power generation layer for a solar cell by a CVD method may include a cleaning unit that uses a UV/ozone to clean a surface of a base substance on which the electric power generation layer is to be formed, before forming the electric power generation layer.

The CVD device according to the embodiment of the present invention may further include a film forming portion that forms the electric power generation layer, wherein the cleaning unit is provided upstream of the film forming portion.

Effects of the Invention

In the present invention, a transparent conductive film is formed by sputtering, and a texture is formed on a surface of the transparent conductive film. Then, before an electric power generation layer is formed, UV/ozone is used to clean the transparent conductive film. Therefore, it is possible to remove contamination at the etching of the transparent conductive film. As a result, in the present invention, it is possible to provide a solar cell manufacturing method capable of preventing a decrease in series resistance, and consequently, a decrease in photoelectric conversion efficiency resulting from the contamination, and capable of fabricating a solar cell with excellent properties.

Furthermore, in the present invention, a cleaning unit that uses UV/ozone to clean the surface of the transparent conductive film after wet etching is performed on the transparent conductive film for a solar cell is employed. Therefore, it is possible to remove the contamination at the time of etching the transparent conductive film. As a result, in the present invention, it is possible to provide an etching device capable of preventing a decrease in properties resulting from the contamination, and capable of fabricating a transparent conductive film (upper electrode) for a solar cell with excellent properties.

Furthermore, in the present invention, a cleaning unit that, before an electric power generation layer for a solar cell is formed by a CVD method, uses UV/ozone to clean a surface of a base substance on which the electric power generation layer is to be formed is employed. Therefore, it is possible to remove contamination on the base substance. As a result, in the present invention, it is possible to provide a CVD device capable of preventing a decrease in properties resulting from the contamination, and capable of fabricating an electric power generation layer for a solar cell with excellent properties.

EMBODIMENTS FOR CARRYING OUT THE INVENTION

Hereunder is a description of embodiments of a solar cell manufacturing method according to the present invention with reference to the drawings. Note that the embodiments is for a specific description for better understanding of the scope of the present invention, and hence is not to be considered as limitative of the present invention unless otherwise specified.

(Solar Cell)

Figure 1:
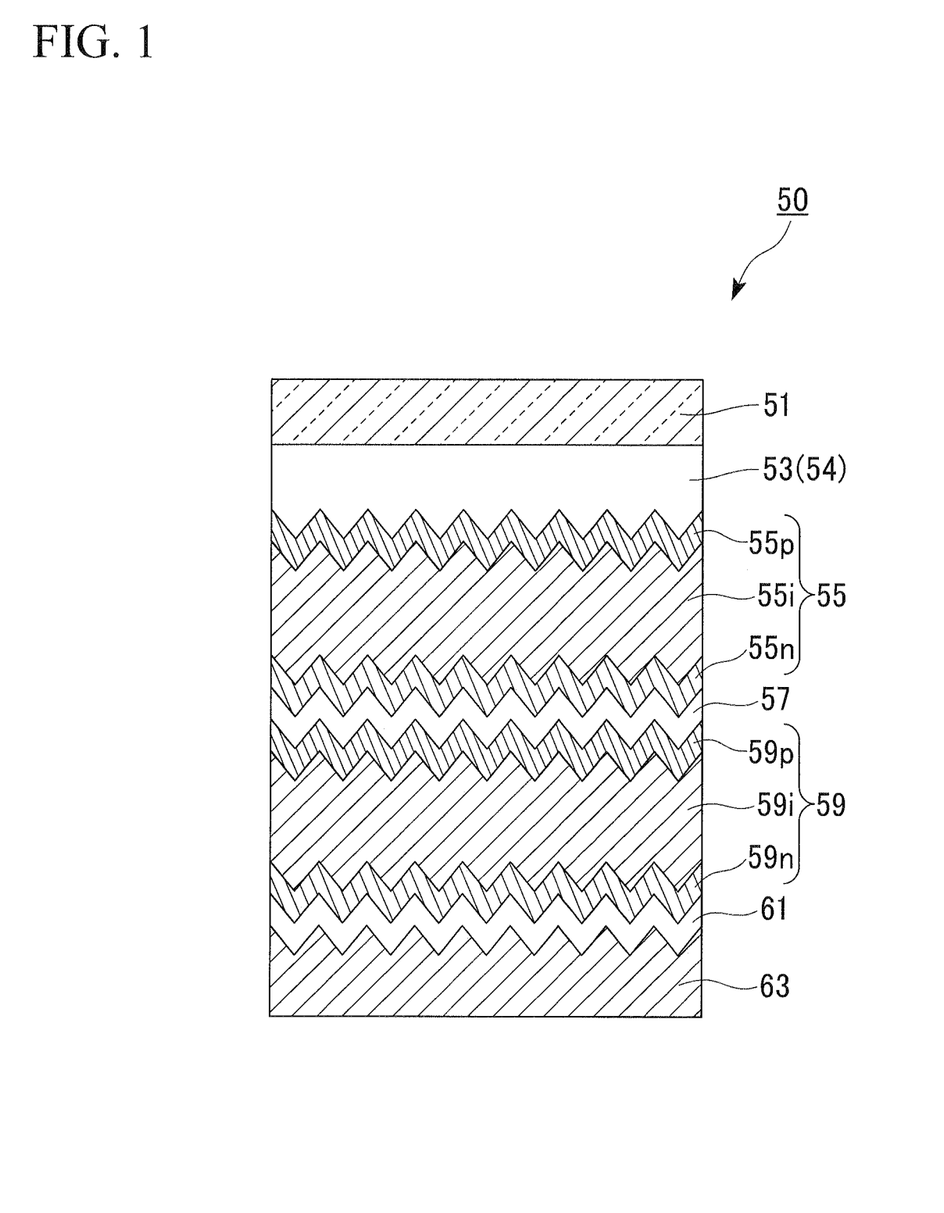
FIG. 1 is a cross-sectional view showing an exemplary solar cell formed by a manufacturing method according to the present invention.

First, a solar cell manufactured in the present embodiment will be described with reference to FIG. 1. FIG. 1 is a cross-sectional view showing an exemplary structure of the solar cell.

In a solar cell 50, there are stacked, in order from top to bottom of the figure: a glass substrate 51 that forms a surface of the solar cell 50; an upper electrode 53 made of a zinc-oxide-based transparent conductive film 54 provided on the glass substrate 51; a top cell 55 made of amorphous silicon (a-Si); an intermediate electrode 57 made of a transparent conductive film; a bottom cell 59 made of microcrystalline silicon (microcrystalline Si); a buffer layer 61 made of a transparent conductive film; and a rear surface electrode 63 made of a metal film. Of these, the intermediate electrode 57 is provided between the top cell 55 and the bottom cell 59.

That is, the solar cell 50 is a solar cell of a-Si/microcrystalline Si tandem type. With the solar cell 50 having such a tandem structure, short-wavelength light is absorbed in the top cell 55 and long-wavelength light is absorbed in the bottom cell 59, to thereby make it possible to improve electric power generation efficiency. Note that the upper electrode 53 is formed with a film thickness of 2000 Å to 10000 Å.

The top cell 55 is made of three layers of: a p-layer 55$p$, an i-layer 55$i$, and an n-layer 55$n$. The i-layer 55$i$ is formed of amorphous silicon. Furthermore, the bottom cell 59 is made of three layers of: a p-layer 59$p$, an i-layer 59$i$, and an n-layer 59$n$, similarly to the top cell 55. The i-layer 59$i$ is made of microcrystalline silicon.

In the solar cell 50 with such a structure, when energy particles, called photons, included in solar rays hit the i-layer, electrons and holes are generated by a photovoltaic effect. The electrons move toward the n-layer. The holes move toward the p-layer. The electrons generated by a photovoltaic effect are extracted by the upper electrode 53 and the rear surface electrode 63. Thereby, light energy can be converted into electric energy.

Furthermore, the intermediate electrode 57 is provided between the top cell 55 and the bottom cell 59. Thereby, part of the light that has reached the bottom cell 59 after passing through the top cell 55 is reflected off the intermediate electrode 57 to be incident on the top cell 55 side again. As a result, the sensitivity property is improved, and it contributes to improvement in electric power generation efficiency.

Furthermore, the solar light incident from the glass substrate 51 passes through the respective layers and is reflected off the rear surface electrode 63. In the solar cell 50, in order to improve the conversion efficiency of light energy, a texture structure is formed on the upper electrode 53. The texture structure has a prism effect of extending the optical path of the solar light incident on the upper electrode 53 and an effect of enclosing light.

(Solar Cell Manufacturing Method)

Next, such a solar cell manufacturing method will be described.

A manufacturing method of a solar cell according to the present embodiment at least includes: a process A (an upper electrode formation process, a transparent conductive film formation process); a process B (a texture formation process); a process C (cleaning process); and a process D (an electric power generation layer formation process), which are executed in this order. In the process A, while a sputtering voltage is being applied to a target made of a formation material (a film formation material) of the transparent conductive film 54, sputtering is performed with a horizontal magnetic field generated on the surface of the target. Thereby, the transparent conductive film 54 is formed on a substrate (a glass substrate 51), and thus the upper electrode 53 is formed. In process B, a texture is formed on a surface of the transparent conductive film 54. In the process C, UV/ozone is used to clean the surface of the transparent conductive film 54 on which the texture is formed. In the process D, an electric power generation layer (a top cell 55) is formed on the upper electrode 53.

In the present embodiment, a transparent conductive film 54 is formed by sputtering, and a texture is formed on a surface of the transparent conductive film 54. Then, before an electric power generation layer is formed, UV/ozone is used to clean the transparent conductive film 54. Therefore, it is possible to remove contamination at the time of etching of the transparent conductive film 54. As a result, in the present embodiment, it is possible to prevent a decrease in series resistance, and consequently, a decrease in photoelectric conversion efficiency of a solar cell resulting from the contamination, and to fabricate a solar cell with excellent properties.

First, in the manufacturing method of a solar cell of the present embodiment, an exemplary sputtering apparatus (deposition apparatus; film formation apparatus) preferable for forming a zinc-oxide-based transparent conductive film 54 used as an upper electrode 53 will be described.

(Sputtering Apparatus 1)

Figure 2:
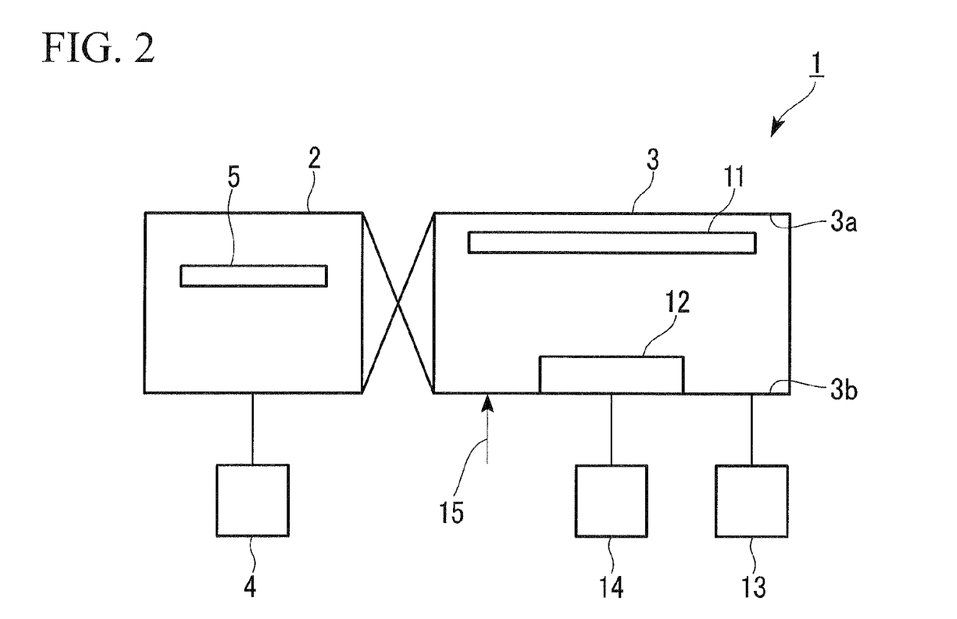
FIG. 2 is a schematic block diagram showing a sputtering apparatus (a deposition apparatus; film forming apparatus) preferable for the manufacturing method according to the present invention.
Figure 3:
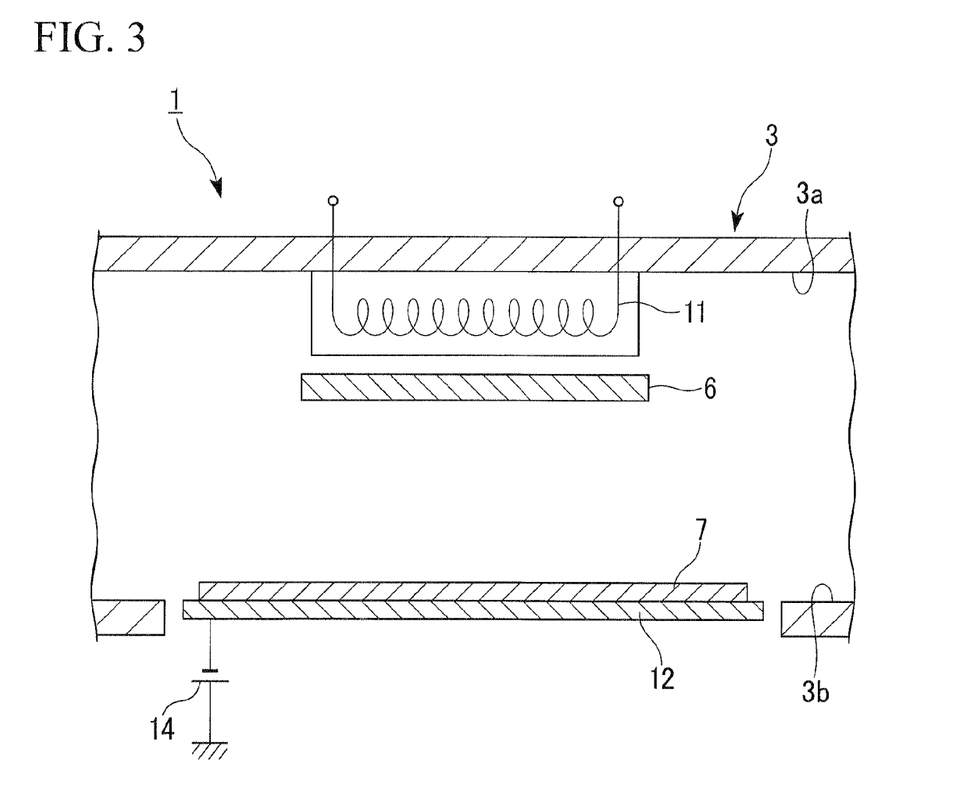
FIG. 3 is a cross-sectional view showing the main part of a film forming chamber used in the sputtering apparatus (the deposition apparatus; film forming apparatus) shown in FIG. 2.

FIG. 2 is a schematic block diagram showing an exemplary sputtering apparatus (deposition apparatus; film formation) used in the solar cell manufacturing method of the present embodiment. FIG. 3 is a cross-sectional view showing the main part of a film forming chamber of the sputtering apparatus shown in FIG. 2. A sputtering apparatus 1 is an inter-back-type sputtering apparatus, which includes, for example: a loading-ejecting chamber 2 into and out of which a substrate such as an alkali-free glass substrate (not shown in the figure); and a film forming chamber (a vacuum chamber) 3 in which a zinc-oxide-based transparent conductive film is formed on a substrate.

The loading-ejecting chamber 2 includes a rough discharge unit 4 such as a rotary pump for producing a rough vacuum in the loading-ejecting chamber 2. In the loading-ejecting chamber 2, a substrate tray 5 for holding and transferring a substrate is movably arranged.

On the other hand, as shown in FIG. 2 and FIG. 3, a heater 11 for heating a substrate 6 are longitudinally provided on one side surface 3a of the film forming chamber 3. On the other side surface 3b, a sputter cathode mechanism (a target holding unit) 12 for holding a target 7 of a zinc-oxide-based material and applying a desired sputtering voltage thereto is longitudinally provided. In addition, on the side surface 3b of the film forming chamber 3, a high vacuum discharge unit 13 such as a turbo molecular pump for producing a high vacuum in the film forming chamber 3, an electric power source 14 for applying a sputtering voltage to the target 7, and a gas introduction unit 15 for introducing a gas into the film forming chamber 3 are provided.

The sputter cathode mechanism 12 is made of a metal plate. The target 7 is bonded (fixed) to the sputter cathode mechanism 12 with a welding material or the like.

The electric power source 14 is for applying a sputtering voltage, in which a high-frequency voltage is superimposed on a direct voltage, to the target 7. The electric power source 14 includes a direct current electric power source and a high-frequency electric power source (not shown in the figures).

The gas introduction unit 15 introduces a sputtering gas such as Ar.

(Sputtering Apparatus)

Figure 4:
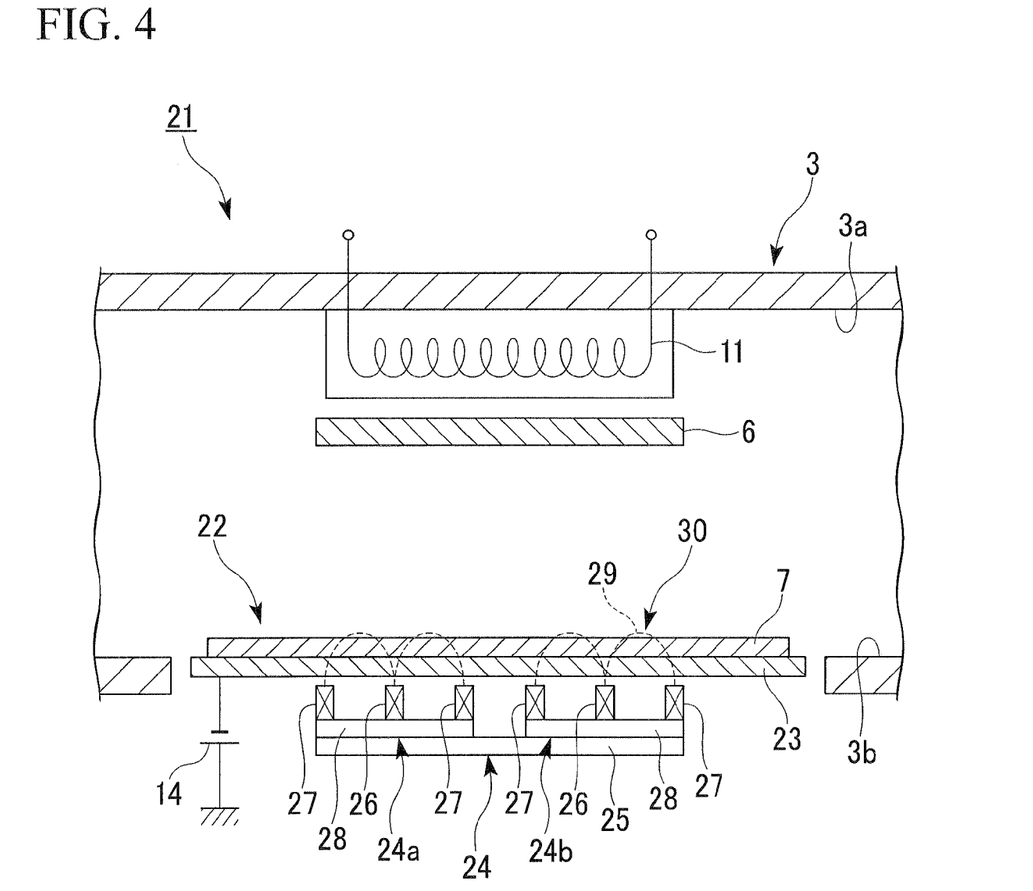
FIG. 4 is a cross-sectional view showing another exemplary sputtering apparatus (deposition apparatus; film forming apparatus) preferable for the manufacturing method according to the present invention.

FIG. 4 is a cross-sectional view showing another exemplary sputtering apparatus used for the solar cell manufacturing method of the present embodiment. That is, FIG. 4 shows the main part of a film forming chamber of an interback-type magnetron sputtering apparatus. A magnetron sputtering apparatus 21 shown in FIG. 4 is different from the sputtering apparatus 1 shown in FIG. 2 and FIG. 3 in that a target 7 made of a zinc-oxide-based material is held on one side surface 3a of a film forming chamber 3 and that a sputter cathode mechanism (a target holding unit) 22 for generating a desired magnetic field is longitudinally provided.

The sputter cathode mechanism 22 includes: a back plate 23 to which the target 7 is bonded (fixed) with a welding material or the like; and a magnetic circuit 24 arranged along a rear surface of the back plate 23. The magnetic circuit 24 is for generating a horizontal magnetic field on a surface of the target 7. In the magnetic circuit 24, a plurality of (two in FIG. 4) magnetic circuit units 24a, 24b are coupled by a bracket 25 into integration. The magnetic circuit units 24a, 24b each include: a first magnet 26; second magnets 27; and a yoke 28 to which the first magnet 26 and the second magnets 27 are attached. The first magnet 26 and the second magnets 27 are different in polarity at their surfaces on the back plate 23 side.

In the magnetic circuit 24, a magnetic field indicated by magnetic field lines 29 is generated by the first magnet 26 and the second magnets 27 that are different in polarity on the back plate 23 side. As a result, at locations on the surface of the target 7 between the first magnet 26 and the second magnets 27, positions 30 at which a vertical magnetic field is 0 (a horizontal magnetic field is maximum) are generated. A high density plasma is generated at the positions 30, thereby it is possible to increase a film formation speed (deposition speed).

In the sputtering apparatus (the deposition apparatus; film formation apparatus) such as shown in FIG. 4, a sputter cathode mechanism 22 for generating a desired magnetic field is longitudinally provided on one side surface 3a of the film forming chamber 3. Therefore, with a sputtering voltage of not more than 340 V and a maximum value of 600 gauss for a horizontal magnetic field strength on the surface of the target 7, it is possible to form (deposit) a zinc-oxide-based transparent conductive film with a regular crystal lattice. The zinc-oxide-based transparent conductive film formed in this manner is unlikely to be oxidized even if it is subjected to be an annealing treatment at high temperatures after formation, and hence is capable of suppressing an increase in specific resistance. Furthermore, if an upper electrode of a solar cell is made of such a zinc-oxide-based transparent conductive film, it is possible to obtain an upper electrode of a solar cell that is excellent in heat resistance.

Next, as an exemplary solar cell manufacturing method according to the present invention, a method of forming a zinc-oxide-based transparent conductive film used as an upper electrode of a solar cell onto a substrate using a sputtering apparatus 1 shown in FIG. 2 and FIG. 3 will be illustrated.

(1) First, while a sputtering voltage is being applied to a target 7 made of a formation material (a film formation material) of the transparent conductive film 54, sputtering is performed with a horizontal magnetic field generated on the surface of the target. Thereby, the transparent conductive film 54 is formed on a substrate (a glass substrate 51) as the upper electrode 53 (process A).

To be more specific, the target 7 is bonded and fixed to the sputter cathode mechanism 12 with a welding material or the like. Here, as a target material, a zinc-oxide-based material may be used such as an aluminum-doped zinc oxide (AZO) in which 0.1 to 10 mass % of aluminum (Al) is doped, and a gallium-doped zinc oxide (GZO) in which 0.1 to 10 mass % of gallium (Ga) is doped. Of these, an aluminum-doped zinc oxide (AZO) is preferable in that it is capable of being formed (deposited) as a thin film with a low specific resistance.

Subsequently, in a state with a substrate 6 (a glass substrate 51) for a solar cell made of, for example, glass being contained in the substrate tray 5 of the loading-ejecting chamber 2, a rough vacuum is produced in the loading-ejecting chamber 2 and the film forming chamber 3 by the rough discharge unit 4. After the loading-ejecting chamber 2 and the film forming chamber 3 have reached a predetermined degree of vacuum, for example, 0.27 Pa (2.0 mTorr), the substrate 6 is transferred from the loading-ejecting chamber 2 to the film forming chamber 3. Then the substrate 6 is arranged in front of the heater 11 in a switched-off state so as to face the target 7. Then, the substrate 6 is heated by the heater 11 to a temperature range of 100° C. to 600° C.

Subsequently, a high vacuum is produced in the film forming chamber 3 by the high vacuum discharge unit 13 to bring the film forming chamber 3 to a predetermined degree of high vacuum, for example, $2.7 \times 10^{-4}$ Pa ($2.0 \times 10^{-3}$ mTorr). After that, a sputtering gas such as Ar is introduced into the film forming chamber 3 by the sputtering gas introduction unit 15 to bring the film forming chamber 3 to a predetermined pressure (sputtering pressure).

Subsequently, a sputtering voltage, for example, a sputtering voltage in which a high-frequency voltage is imposed on a direct current voltage, is applied to the target 7 by the electric power source 14. The application of the sputtering voltage generates plasma on the substrate 6. Ions of the sputtering gas such as Ar that are excited by the plasma collide with the target 7 to cause the atoms forming the zinc-oxide-based material such as aluminum-doped zinc oxide (AZO) or gallium-doped zinc oxide (GZO) to be emitted from the target 7, to thereby form (deposit) a transparent conductive film 54 made of a zinc-oxide-based material onto the substrate 6.

Subsequently, the substrate 6 (the glass substrate 51) is transferred from the film forming chamber 3 to the loading-ejecting chamber 2. Then, the vacuum in the loading-ejecting chamber 2 is broken, and the substrate 6 (the glass substrate 51) on which the zinc-oxide-based transparent conductive film 54 is formed is taken out.

(2) Next, a texture is formed on the surface of the transparent conductive film 54 (process B). Here, a wet etching method is used to form the texture.

Subsequently, an oxalic-acid-based etching solution or the like is used to perform a wet etching treatment on the transparent conductive film 54. Thereby, a fine texture is formed on the surface of the transparent conductive film 54.

At this time, a carbon-based contamination is generated on the transparent conductive film 54 due to the etching treatment. The contamination degrades a series resistance of the solar cell to be obtained, and decreases its conversion efficiency.

(3) Therefore, in the present embodiment, the surface of the transparent conductive film 54 on which the texture is formed is cleaned by use of UV/ozone (process C).

Cleaning by use of UV/ozone can remove the carbon-based contamination produced at the time of etching of the transparent conductive film. As a result, in the present embodiment, it is possible to prevent a decrease in series resistance, and consequently, a decrease in photoelectric conversion efficiency resulting from the contamination, and hence to fabricate a solar cell with excellent properties.

Figure 5:
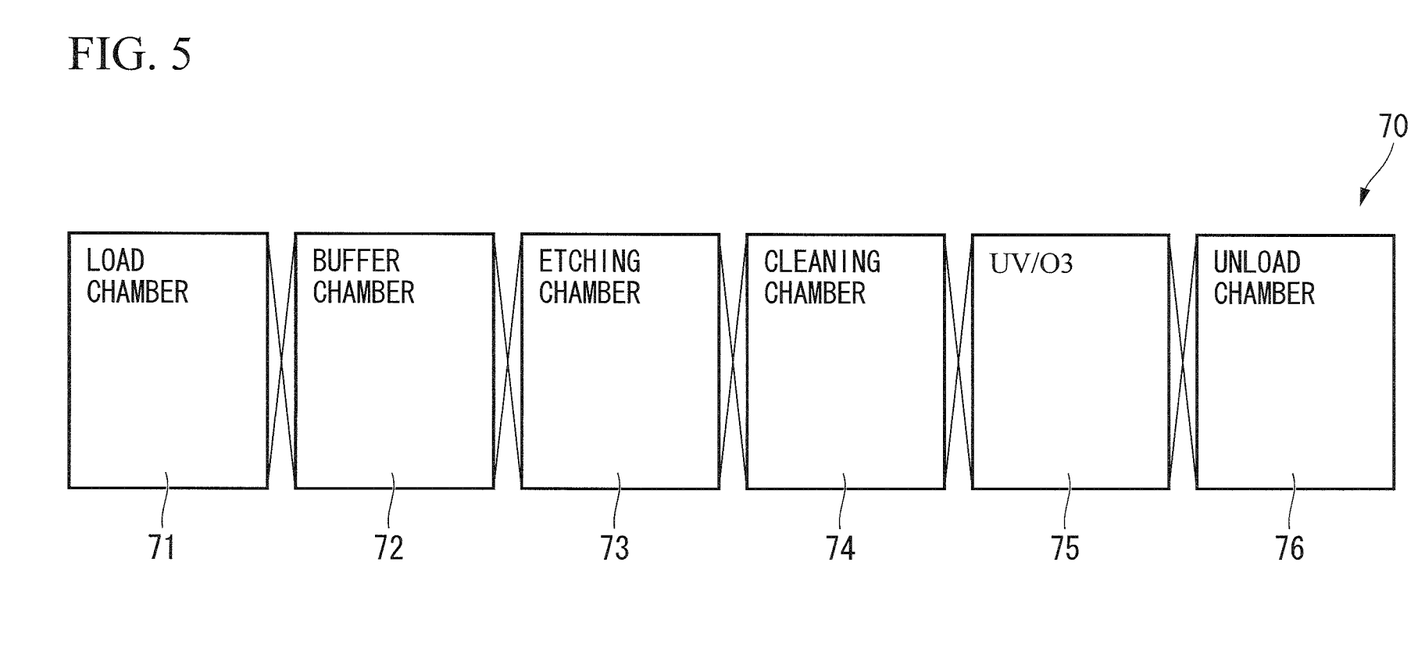
FIG. 5 is a schematic view showing an exemplary etching device according to the present invention.

At this time, it is preferable that an etching device of the present embodiment be used when wet etching is performed on the transparent conductive film 54. FIG. 5 is a diagram schematically showing an etching device of the present invention.

An etching device 70 includes: a load chamber 71 (L chamber); buffer chamber 72; an etching chamber 73; a cleaning chamber 74; a UV/ozone cleaning chamber 75 (UV/O3); and an unload chamber 76 (UL chamber). Thus, the etching device 70 of the present embodiment is characterized in that a cleaning unit (a UV/ozone cleaning chamber 75) that uses UV/ozone to clean the surface of the transparent conductive film is provided after wet etching (an etching chamber 73).

The etching device 70 of the present embodiment includes a cleaning unit that uses UV/ozone to clean the surface of the transparent conductive film 54 after wet etching is performed on the transparent conductive film 54 for a solar cell. Therefore, it is possible to clean and remove contamination at the time of etching of the transparent conductive film 54. As a result, in the present embodiment, it is possible to prevent a decrease in property resulting from the contamination, and hence to fabricate a transparent conductive film 54 (an upper electrode 53) for a solar cell with excellent properties.

Thus, the substrate 6 (the glass substrate 51) on which the zinc-oxide-based transparent conductive film 54 is formed is obtained.

(4) Next, an electric power generation layer is formed on the upper electrode 53 (process D).

A formation material of an electric power generation layer (which, here, refers to a top cell 55 made of a p-layer 55*p*, an i-layer 55*i*, and an n-layer 55*n*) is plasmatized on the upper electrode. Then, the material is evaporated and laminated on the upper electrode, to thereby form an electric power generation layer.

Figure 6:
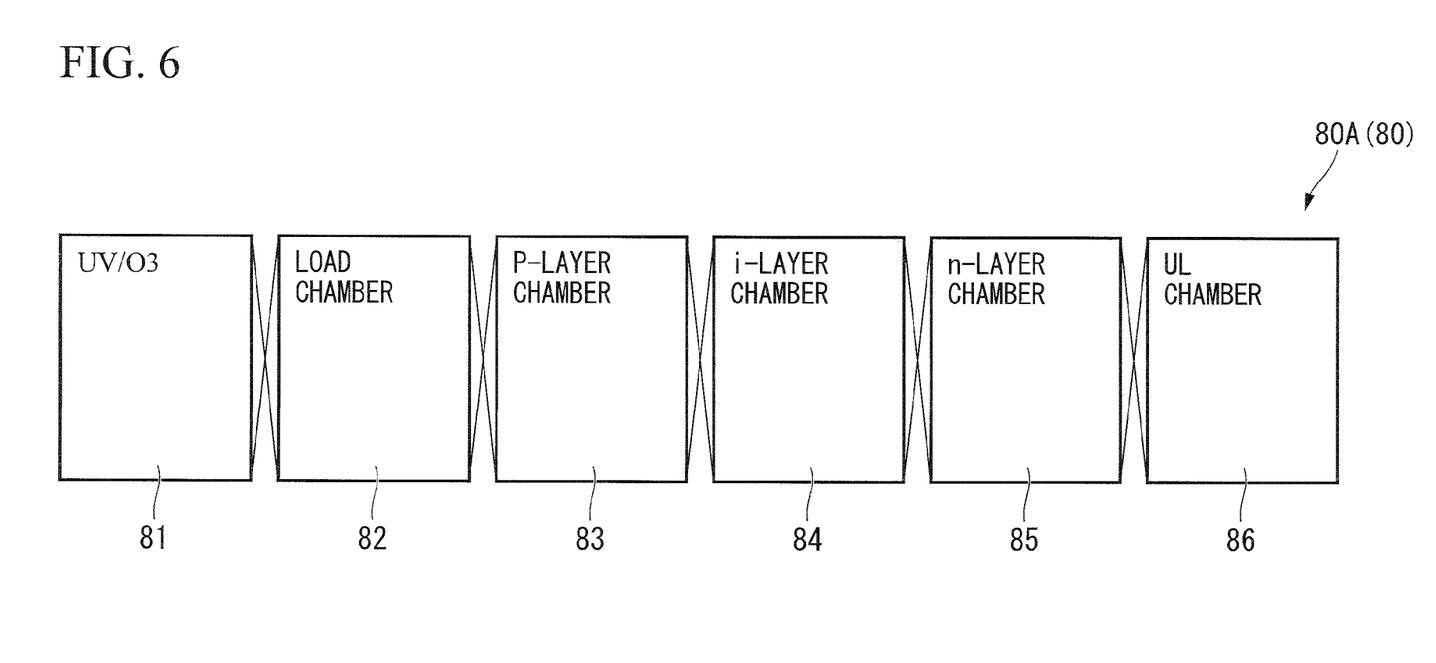
FIG. 6 is a schematic view showing an exemplary CVD device according to the present invention.
Figure 7A:
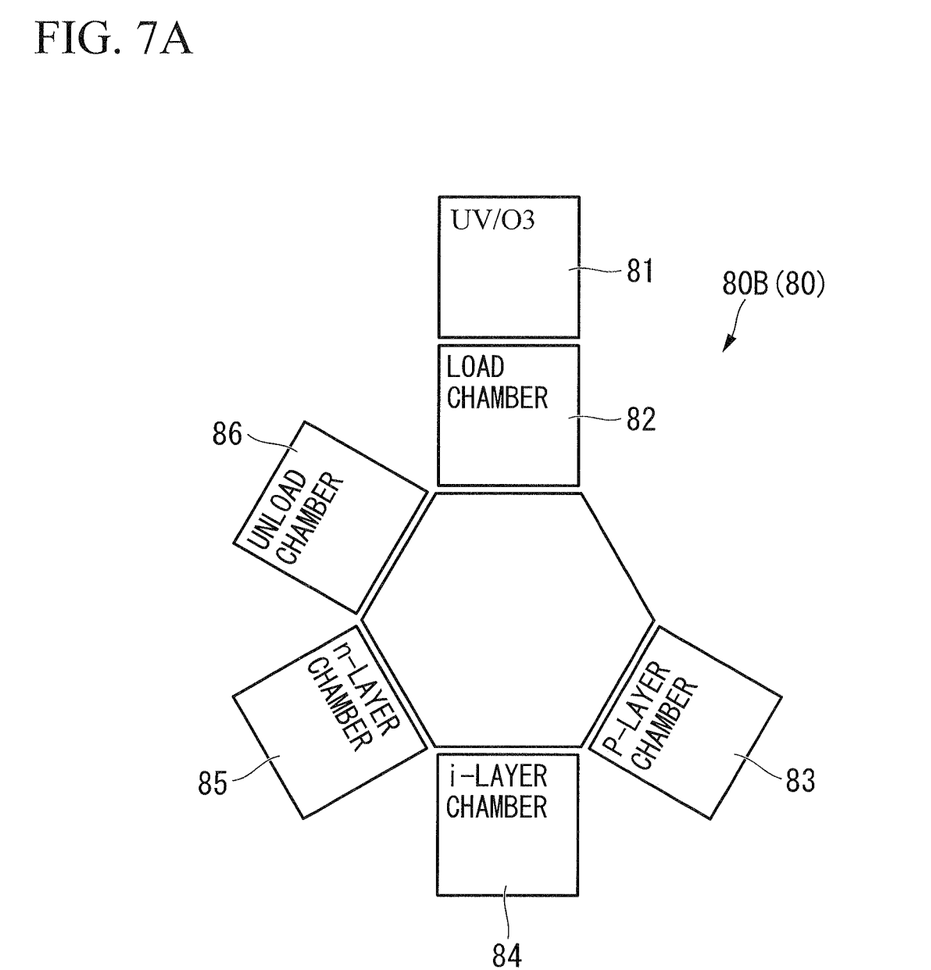
FIG. 7A is a schematic view showing another exemplary CVD device according to the present invention.
Figure 7B:
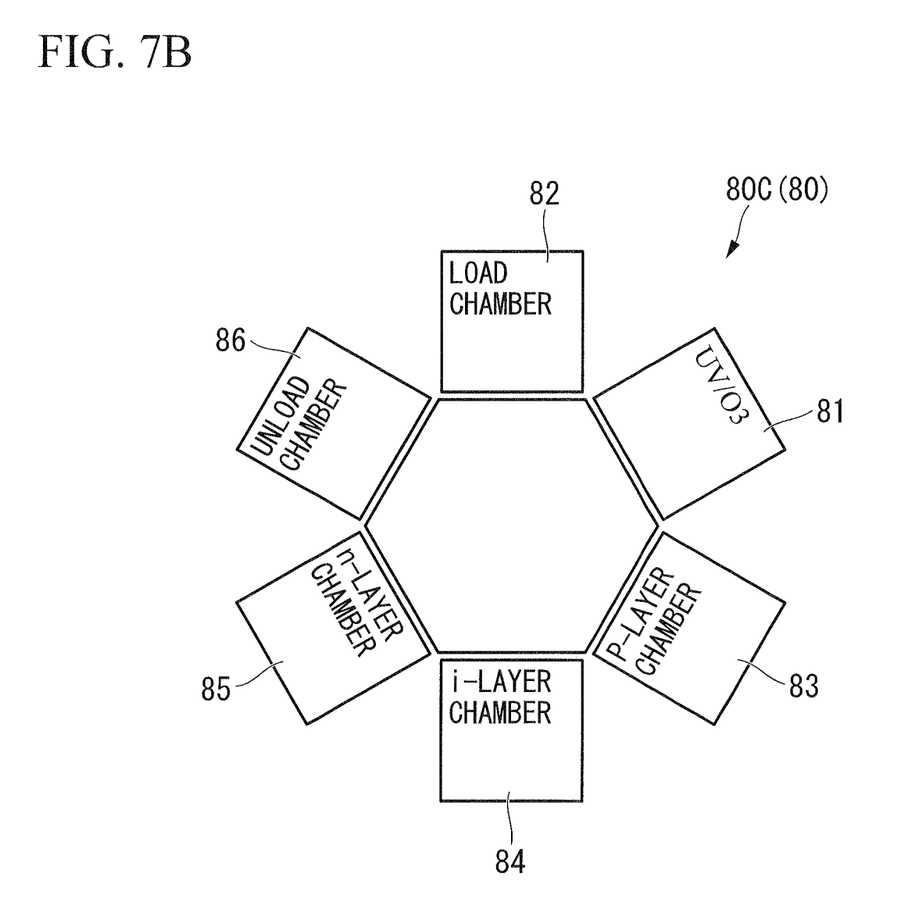
FIG. 7B is a schematic view showing another exemplary CVD device according to the present invention.

Here, when an electric power generation layer for a solar cell is formed by a CVD method, it is preferable that a CVD device of the present embodiment be used. FIG. 6 and FIG. 7 are diagrams schematically showing an exemplary CVD device of the present embodiment.

A CVD device 80 includes: a UV/ozone cleaning chamber (UV/O3) 81; a load chamber (L chamber) 82; film forming chambers 83, 84, and 85 for respectively forming a p-layer, an i-layer, and an n-layer; and a UL chamber 86.

Thus, the CVD device 80 of the present embodiment is characterized by having a cleaning unit (a UV/ozone cleaning chamber 81), that uses UV/ozone to clean a surface of a base substance on which the electric power generation layer is to be formed, before forming the electric power generation layer.

The CVD device 80 of the present embodiment has a cleaning unit that, before an electric power generation layer for a solar cell is formed by a CVD method, uses UV/ozone to clean a surface of a base substance on which the electric power generation layer is to be formed. Therefore, it is possible to remove contamination on the base substance. As a result, according to the present embodiment, a decrease in properties resulting from the contamination is suppressed. Accordingly, it is possible to fabricate an electric power generation layer for a solar cell with excellent solar cell properties.

The CVD device 80A (80) shown in FIG. 6 is an in-line type apparatus. The CVD devices 80B, 80C (80) shown respectively in FIG. 7A and FIG. 7B are cluster-type apparatuses.

The UV/ozone cleaning characterizing the present embodiment is not required to be performed under a reduced pressure. Therefore, as shown in FIG. 7A, the cleaning unit is provided before the load chamber 82. However, in the case where the presence and absence of the UV/ozone treatment are conditionally mixed, the cleaning unit may be provided as one of the chambers in the cluster-type CVD device as shown in FIG. 7B.

The solar cell that has been obtained through at least the above processes is cleaned by use of UV/ozone after formation of a texture on the surface of the transparent conductive film and before formation of the electric power generation layer. Therefore, it is possible to remove contamination at the time of etching of the transparent conductive film. As a result, the solar cell thus obtained is capable of preventing a decrease in series resistance, and consequently, a decrease in photoelectric conversion efficiency resulting from the contamination. Accordingly, the solar cell has excellent properties.

In the solar cell manufacturing method according to the present embodiment, the two of the etching device and the CVD device according to the present embodiment, which have a cleaning unit that uses UV/ozone, may be used in combination, or only either one of them may be used.

While the solar cell manufacturing method according to the present embodiment has been described, the present invention is not limited to this. Appropriate modifications can be made without departing from the scope of the present invention.

EXAMPLE

Hereunder is a description of an example of the embodiment with reference to the drawings.

The sputtering apparatus (the deposition apparatus) 1 as shown in FIG. 2 and FIG. 3 was used to form (deposit) a transparent conductive film onto a substrate.

First, a target 7 with a size of 5 inches×16 inches was attached to a sputter cathode mechanism 12. As the target 7, a film formation material was used in which ZnO was doped with 2 weight % of $Al_2O_3$ as an impurity. Furthermore, with the settings for a heater 11 being adjusted so that the substrate would have a temperature of 250° C., a film forming chamber 3 was heated.

After that, an alkali-free glass substrate (a substrate 6) was put into a loading-ejecting chamber 2. After vacuum of the loading-ejecting chamber 2 by a rough discharge unit 4, the substrate 6 was transferred to the film forming chamber 3. At this time, the film forming chamber 3 was kept to a predetermined degree of vacuum by a high vacuum discharge unit 13.

After an Ar gas as a process gas was introduced with a pressure of 5 mTorr from a sputtering gas introduction unit 15, an electric power of 1 kW was applied to a sputter cathode mechanism 12 from a DC electric power source, to thereby sputter the ZnO-based target to which the sputter cathode mechanism 12 was attached.

With these operations as a series of flows, the ZnO-based transparent conductive film was formed with a thickness of 500 nm on the alkali-free glass substrate.

After that, the substrate was taken out from the loading-ejecting chamber 2.

After that, the transparent conductive film was wet-etched by being immersed for two minutes in an oxalic-acid-based etching solution kept at 40° C. Thereby, a texture was formed on the surface of the transparent conductive film.

Figure 8:
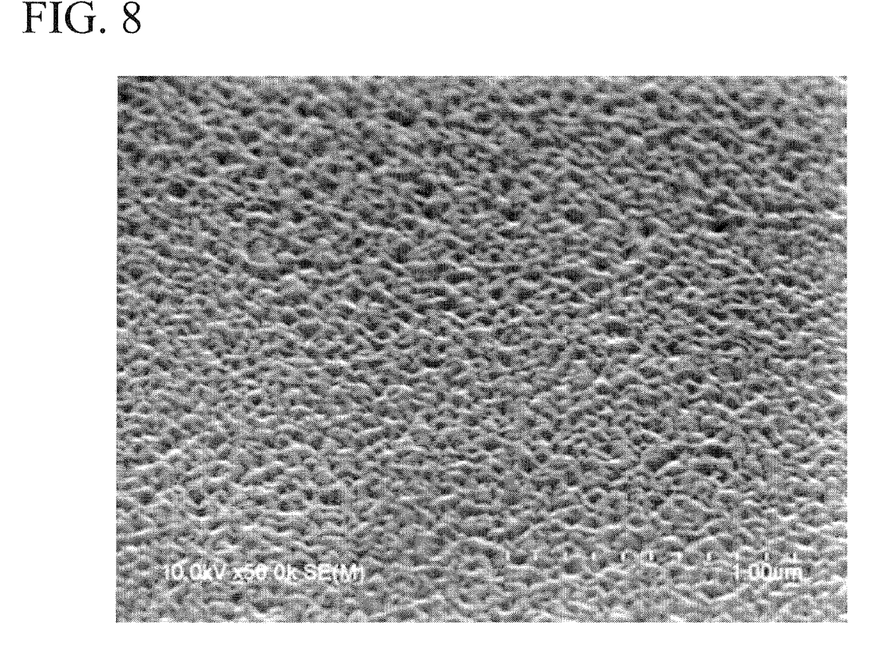
FIG. 8 is a diagram showing a SEM image of a transparent conductive film before etching.
Figure 9:
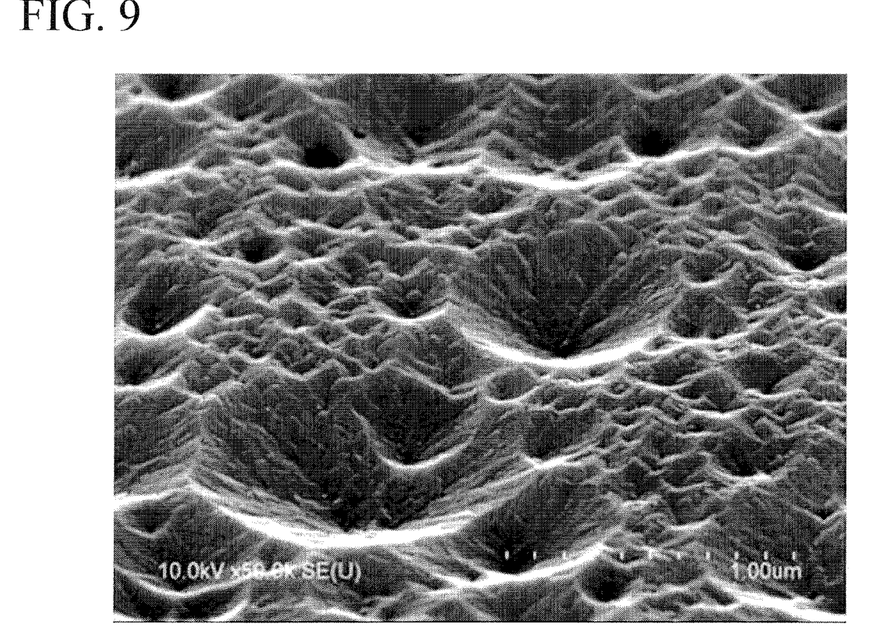
FIG. 9 is a diagram showing a SEM image of the transparent conductive film after etching.

FIG. 8 shows a surface SEM image of the transparent conductive film before the etching treatment. FIG. 9 shows a surface SEM image of the transparent conductive film after the etching treatment. With the comparison between FIG. 8 and FIG. 9, it was confirmed that a texture was formed by the etching treatment.

After formation of the texture structure, the transparent conductive film was subjected to UV/ozone cleaning for ten minutes.

Figure 10:
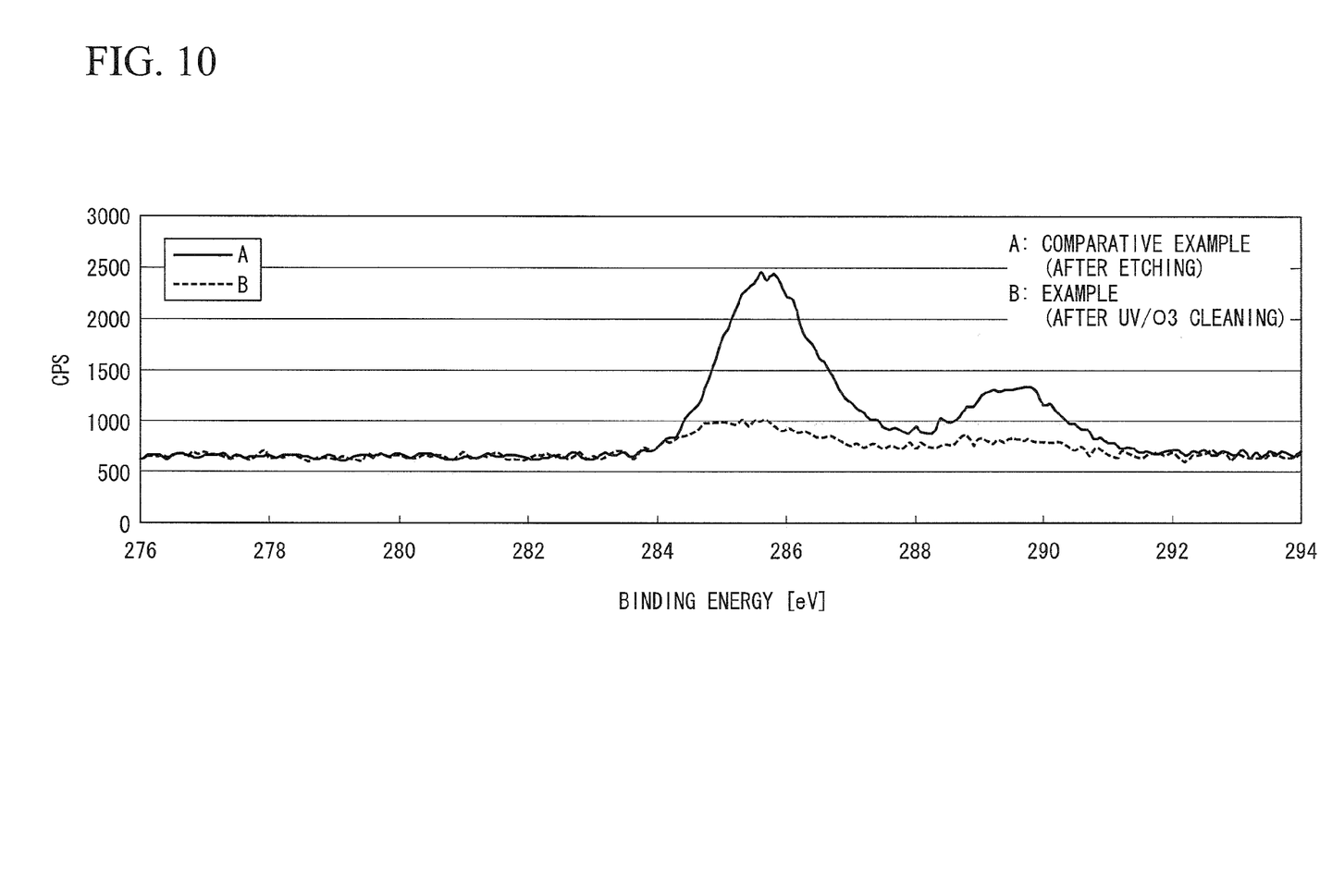
FIG. 10 is a diagram showing an XRD measurement results for transparent conductive films of the Example and the Comparative Example.

Analysis results performed by XPS for the transparent conductive film subjected to UV/ozone cleaning (Example) and the transparent conductive film not subjected to UV/ozone cleaning (Comparative Example) are shown in FIG. 10. As is clear from FIG. 10, in Comparative Example, peaks are found near 285 eV and 289 eV of the binding energy. This is conceivably due to contamination, derived from carbon that is generated at the time of etching treatment. On the other hand, in Example that was subjected to UV/ozone cleaning, peaks are not present at the same energy levels. This indicates that the contamination has been removed by the UV/ozone cleaning.

In addition, in order to evaluate the effect of the surface contamination on the ZnO transparent conductive film to the solar cell performance, the obtained transparent conductive film was used as an upper electrode to fabricate a mini solar cell, and the solar cell performance of which was evaluated by a solar simulator.

For the transparent conductive films of Example and Comparative Example, solar cell properties (also referred to as "electric power generation properties") [conversion efficiency (Eff), short circuit current density (Jsc), open circuit voltage (Voc), fill factor (F.F.), shunt resistance (Rsh), and series resistance (Rs)] are listed in Table 1.

TABLE 1

|  | Eff [%] | Jsc [mA/cm$^2$] | Voc [V] | F.F. | Rsh [Ω] | Rs [Ω] |
| --- | --- | --- | --- | --- | --- | --- |
| Example | 8.6 | 13.6 | 879 | 0.72 | 10720 | 24 |
| Comp. Ex. | 7.0 | 13.3 | 858 | 0.62 | 9332 | 126 |

As is clear from Table 1, in Comparative Example in which contamination was generated on the surface of the transparent conductive film, the series resistance (Rs) is high, and the fill factor (F.F.) is degraded. This leads to a decrease in conversion efficiency (Eff). On the other hand, in Example in which contamination on the surface of the transparent conductive film was removed by UV/ozone cleaning, it has been shown that the series resistance (Rs) is low, that the degradation of the fill factor (F.F.) is suppressed, and that the conversion efficiency (Eff) is improved.

From this, it has been shown that, with UV/ozone cleaning being performed between the process of forming a texture by wet etching and the process of forming (depositing) an electric power generation layer, it is possible to remove contamination generated at the time of etching, to suppress degradation in series resistance, and consequently, to improve photoelectric conversion efficiency.

INDUSTRIAL APPLICABILITY

The present invention is widely applicable to a solar cell manufacturing method in which an upper electrode functioning as an electric power extracting electrode on the light incident side is made of a transparent conductive film whose basic constituent element is ZnO.

DESCRIPTION OF THE REFERENCE SYMBOLS

| | |
| --- | --- |
| 50: | solar cell |
| 51: | glass substrate (substrate) |
| 53: | upper electrode |
| 54: | transparent conductive film |
| 55: | top cell |
| 59: | bottom cell |
| 57: | intermediate electrode |
| 61: | buffer layer |
| 63: | rear surface electrode |

What is claimed is:

1. A solar cell manufacturing method that forms a transparent conductive film of ZnO as an electric power extracting electrode on a light incident side, the method comprising, at least in a following order:

a process A forming the transparent conductive film on a substrate by applying a sputtering voltage to sputter a target made of a film formation material for the transparent conductive film;

a process B forming a texture on a surface of the transparent conductive film;

a process C cleaning the surface of the transparent conductive film on which the texture has been formed using an UV/ozone; and a process D forming an electric power generation layer on the transparent conductive film.

2. The solar cell manufacturing method according to claim 1, wherein a horizontal magnetic field is generated while the sputtering voltage is being applied, to thereby the target is sputtered.

3. The solar cell manufacturing method according to claim 1, wherein an upper electrode as the electric power extracting electrode on the light incident side is formed by using the transparent conductive film.

4. The solar cell manufacturing method according to claim 1, wherein in the process B, the texture is formed by wet etching.

5. The solar cell manufacturing method according to claim 1, wherein in the process A, a material in which ZnO is doped with a substance including Al or Ga is used as the film formation material for the transparent conductive film.

6. The solar cell manufacturing method according to claim 4, wherein an oxalic-acid-based etching solution is used as an etching solution.

7. The solar cell manufacturing method according to claim 1, wherein the electric power generation layer is a silicon thin film.

8. The solar cell manufacturing method according to claim 4, wherein in the process A, a material in which ZnO is doped with a substance including Al or Ga is used as the film formation material for the transparent conductive film.

* * * * *